(12) United States Patent
Chakravarti et al.

(10) Patent No.: US 7,531,886 B2
(45) Date of Patent: May 12, 2009

(54) MOSFET FUSE PROGRAMMED BY ELECTROMIGRATION

(75) Inventors: Satya N. Chakravarti, Hopewell Junction, NY (US); Thekkemadathil V. Rajeevakumar, Scarsdale, NY (US); Timothy J. Sullivan, Franklin Lakes, NJ (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 11/428,923

(22) Filed: Jul. 6, 2006

(65) Prior Publication Data

US 2008/0006902 A1  Jan. 10, 2008

(51) Int. Cl.
*H01L 23/525* (2006.01)
(52) U.S. Cl. ................ 257/530; 257/209; 257/E23.147
(58) Field of Classification Search ................ 257/209, 257/530, E23.147
See application file for complete search history.

(56) References Cited

U.S. PATENT DOCUMENTS

| | | | | |
|---|---|---|---|---|
| 4,903,111 A | * | 2/1990 | Takemae et al. | 257/209 |
| 5,774,011 A | | 6/1998 | Au et al. | |
| 6,511,871 B2 | * | 1/2003 | Joo et al. | 438/166 |
| 6,624,499 B2 | | 9/2003 | Kothandaraman et al. | |
| 7,105,429 B2 | * | 9/2006 | Jawarani | 438/592 |
| 7,384,853 B2 | * | 6/2008 | Chen et al. | 438/376 |

* cited by examiner

*Primary Examiner*—Victor A Mandala
(74) *Attorney, Agent, or Firm*—H. Daniel Schnurmann (57) ABSTRACT

A one-time programmable field effect transistor (FET) e-fuse has a silicided gate connected to the drain while the source is grounded. A voltage stimulus applied to the drain forces current to flow through the channel coupling the drain to the source. The magnitude of the current exceeding the threshold current density initiates electromigration of the source/drain silicide into the channel region, such that the source/drain of the FET is shorted to the substrate after programming. Under these constraints, the fuse device conducts current even when the transistor is in the off-state. The MOSFET e-fuse preferably uses a minimum channel length NFET/PFET and scales down its dimensions to conform to those allowed by the technology.

14 Claims, 6 Drawing Sheets

Is-Vd @Vg=0.0V and Vd=1.0V
BEFORE PROGRAMMING

Programming conditions:SGNFET-2.0x0.06
Drain:5V pulse; 10 us pulsewidth
Gate: Shorted to drain
Source, Substrate shorted to ground Is-Vd @Vg=0.0V and Vd=1.0V
AFTER PROGRAMMING

Fig. 7 ns to replace identical circuits by adjusting a circuit by adjust-

MOSFET FUSE PROGRAMMED BY ELECTROMIGRATION

FIELD OF THE INVENTION

The present invention is generally related to integrated circuit (IC) structures, and more particularly, to a one-time programmable Metal Oxide Semiconductor Field Effect Transistor (MOSFET) that is programmed by an electromigration mechanism.

DESCRIPTION OF RELATED ART

In integrated circuits including CMOS integrated circuits, it is often desirable to permanently store information or to form permanent connections after it is manufactured. Examples of such applications are Electronic Chip Identification (ECID) and One-Time Programmable Read Only Memory (OTPROM). Fuses are devices forming fusible links which are frequently used for this purpose. Fuses can also be used to program redundant elements to replace identical defective elements, e.g., in semiconductor memories. Further, fuses are used to modify the speed of a circuit by adjusting the resistance of the current path.

Conventional metal fuses are "programmed" or "blown" by a laser to open a link after a semiconductor device is processed and passivated. This type of fuses requires a precise alignment of the laser on the fuse to avoid destroying neighboring devices, which often results in causing damage to the device passivation layer, and which leads to reliability problems. By way of example, the process of blowing the fuse can cause a rupture in the capping and passivation layers when fuse material is displaced.

The principle of the operation of an electrical fuse is based on electromigration and/or rupture of the device. These types of fuses include a silicide layer deposited and reacted on a highly doped polysilicon line, which are simultaneously fabricated when forming and siliciding the gate structure of the MOSFET. No additional mask steps or processing are required for the formation of the electrical fuses. Contacts are formed to the silicided device on two sides of a narrow fuse link region known as anode and cathode, respectively, and which provide an electrical connection between the fuse and external circuits for programming and sensing. The structure is capped with insulating films which are the same as the silicided gate stack of MOSFET devices before/after contacts.

As previously described, the programming of fuse devices must not lead to damages of surrounding structures and cause reliability concerns. That is, the programmed fuse resistance may be unstable during reliability stress testing. This is due to the uncontrolled nature of the rupture and/or relatively wide variation in programmed resistances of these fuses which are often interspersed with low resistance fuses causing fails during sensing in an array environment. Further, these types of device programming may not be viable for use in many of the latest process technologies because of the relatively higher programming voltage and current requirement as compared to the electromigration technique. The rupture method of programming also results in added restrictions on the metal interconnects positioned over the fuse.

In order to circumvent the previously stated drawbacks, it has been determined that an alternate programming method based on electromigration is advantageously used to replace existing methodologies. By way of example, U.S. Pat. No. 6,624,499 to Kothandaraman et al., describes a semiconductor fuse which includes a cathode and an anode coupled by a fuse link having an electrically conductive component, such as a narrow silicided polysilicon line (doped or undoped) that is attached to a power supply. A potential is applied across the conductive fuse link via the cathode and anode in which the potential is of a magnitude and direction to initiate electromigration of silicide from a region of the semiconductor fuse reducing the conductivity of the fuse link. The effectiveness of programming is enhanced by commencing a temperature gradient between the fuse link and the cathode responsive to the applied potential. Portions of the semiconductor fuse are then selectively cooled in a heat transfer relationship to increase the temperature gradient. In one embodiment, a heat sink is applied to the cathode. The heat sink is preferably a layer of metal coupled in close proximity to the cathode while insulated from the fuse link.

Figure 1:
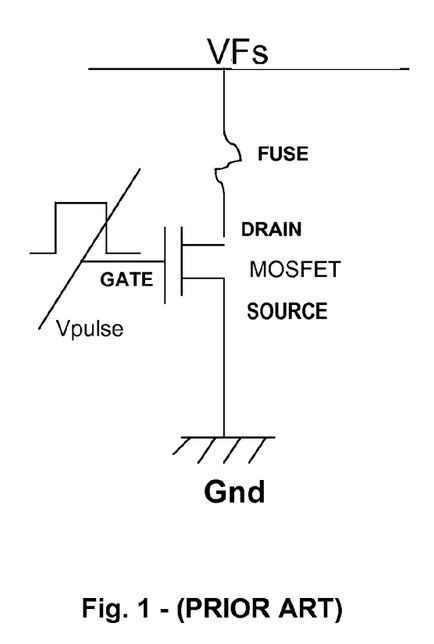
FIG. 1 is a circuit schematic of a prior art electrical fuse showing the fuse in series with a programming MOSFET device.

Referring to FIG. 1, there is shown a circuit schematic of a prior art electric fuse illustrating the fuse in series with a programming MOSFET. The fuse is made of a silicided p+ doped narrow polysilicon line with two terminals called "anode" (VFs) and "cathode" (drain). The cathode end of the fuse is connected to the drain end of the programming MOSFET and the anode end is connected to a power supply referenced as VFs in the figure. The fuse has a typical initial resistance value of about 200 ohms or less, depending on the width, length and doping level of the fuse link. When the programming transistor switches on by applying a voltage pulse to the gate of the MOSFET, the fuse changes its resistance from a low initial resistance value to a high resistance, generally of the order of 10 Kohms or higher, caused by electromigration of the silicide from the fuse cathode terminal towards the positively biased fuse anode terminal through the narrow fuse link region. This type of fuses requires the use of a voltage supply (VFs) of ~4V, a pulse programming current of 9 mA, and a pulse width of 200 μsec.

The aforementioned patent describes an undesirable effect, i.e., the creation of a 'hot spot' that necessitates the use of a heat sink to ensure that programming the fuse element (or programmable fuses when a plurality of such devices of the same type are arranged in an array configuration) does not lead to rupturing the fuse and, thus, introduces reliability problems by potentially damaging neighboring fuses in the near vicinity of the fuse(s) being programmed.

Therefore, there exists a need for an alternative electrical fuse structure with reduced on-chip area requirement and a programming method which recognizes the aforementioned problems and which reduces the programming current, and/or voltage and programming time while at the same time ensuring electromigration when programming the fuse. There is a further need to achieve a large change in resistance or conductance between pre and post programmed states of the device to improve sensing and, therefore, minimizing sense fails and circuit yield loss.

OBJECTS AND SUMMARY OF THE INVENTION

Accordingly, it is an object of the invention to provide a MOSFET fuse that is programmable by electromigration but which avoids forming a 'hot spot' in the channel of the MOSFET when programming the fuse.

It is another object to provide a MOSFET fuse in which the programming mechanism is activated by inducing electromigration in the channel of the FET device when applying a high voltage between the drain junction and the source junction, while maintaining the gate of the device shorted to the drain or source terminals.

It is a further object to provide a fuse element of significantly reduced size to allow reaching the required current density at a lower voltage level and achieving smaller area requirements leading to a higher density of fuses in the chip.

It is still another object to provide a programmable fuse that is equally effective for NFETs as it is for PFET MOSFET fuses.

It is a yet a further object to fully utilize the junction breakdown to achieve source to drain changes between programmed and unprogrammed fuse elements.

It is still a further object to provide a single device unconnected to any access devices.

A one-time programmable (OTP) fuse element is formed from a Field Effect Transistor (FET) in which, both n-type (NFET) and p-type (PFET) transistors are used as programmable elements. Programming is achieved by inducing electromigration of the silicide through the FET channel region. When a high amplitude voltage pulse of appropriate polarity and duration is applied between the drain and the source of the MOSFET, silicide electromigration takes place from the source (lower potential) terminal to the drain (higher potential) terminal through the channel region. This phenomenon alters the conductivity of the NFET or PFET device channel by several orders of magnitude following programming when the device is held in the off-state. This is achieved while keeping the gate terminal grounded, and a DC bias of appropriate polarity and magnitude being applied between the drain and the source terminals. For an unprogrammed device, the current through the channel in the off-state is negligible. Thus, the MOSFET fuse switches from a low conductive (high resistance) state to a high conductive (low resistance) state after programming, in contrast to a polysilicon fuse where the transition in resistance between pre and post programming is the reverse. Such MOSFET fuses are also referred to as "antifuse" devices.

The voltage pulse of appropriate polarity and amplitude between the drain and the source that is applied increases the channel conductance by 4 to 5 orders of magnitude, and precludes forming a "hot spot" in the channel of the MOSFET fuse. The programming voltage required to program a thin oxide (i.e., equivalent oxide thickness <20 Å) NFET e-fuse with a high conductance change ratio requires preferably a pulse amplitude $\leq$5V at a minimum pulse width of 10 μsec applied to the drain junction of a MOSFET device 2 μm wide by 60 nm length when the gate and drain terminals are attached to each other. The source (and substrate terminal, if available) is grounded. Similarly, a PFET e-fuse in a similar configuration is programmed by way of a negative polarity pulse, requiring a higher (absolute) voltage $\leq$−8V for a typical sized device.

MOSFET e-fuses use a minimum channel length NFET/PFET allowed by the technology, thus scaling down their dimensions in step with the technology in use, unlike conventional polysilicon electromigration type e-fuses.

The present invention provides a field effect transistor (FET) fuse integral to a substrate that includes:
a silicided gate, source and drain, wherein the source and drain are coupled to each other by a channel; and
a voltage stimulus applied to the drain maintaining the source grounded and the gate connected to the drain, the applied voltage inducing electromigration in the channel by current flowing through the channel.

BRIEF DESCRIPTION OF THE DRAWINGS

These and other objects, aspects and advantages of the invention will be better understood from the detailed preferred embodiment of the invention when taken in conjunction with the accompanying drawings.

DETAILED DESCRIPTION OF THE INVENTION

Figure 2:
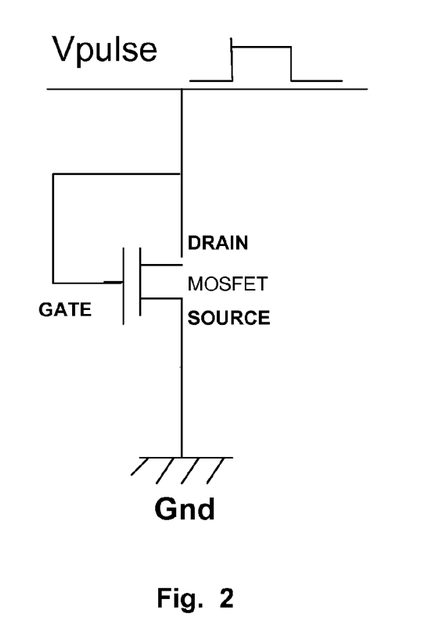
FIG. 2 is a circuit schematic of the fuse device in accordance with the present invention, to which the electromigration mechanism is to be generated.

Referring now to FIG. 2, a schematic diagram of a MOSFET e-fuse is illustrated, in accordance with the present invention.

In a preferred embodiment, there is shown a field effect transistor (FET) fuse integral to a substrate having a source, a drain, and a silicided gate, in which the source and drain are coupled to each other by a channel. A voltage stimulus is applied to the drain, maintaining the source grounded, while the gate is connected to the drain. The applied voltage induces electromigration through the channel by current flowing through the channel.

Figure 3A:
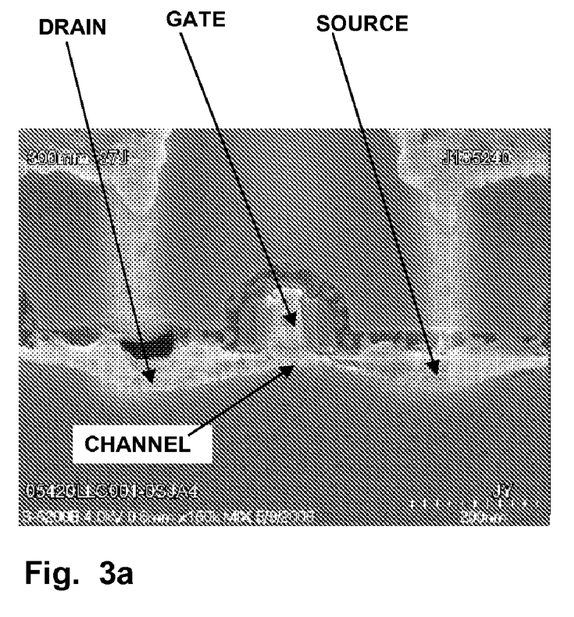
FIG. 3a shows a scanning electron microscope (SEM) cross-section view of a thin oxide gate NFET e-fuse after programming, according to the present invention.
Figure 3B:
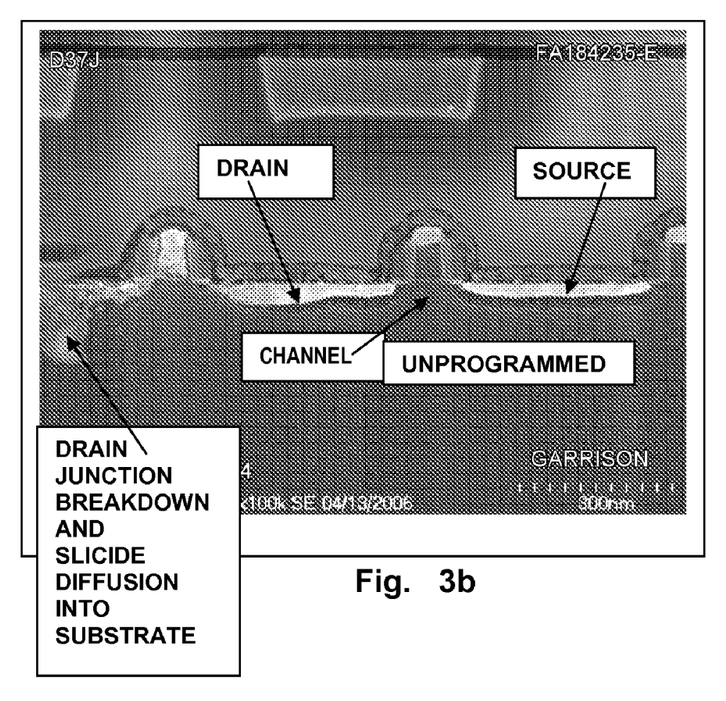
FIG. 3b illustrates a corresponding SEM view of the same fuse device shown in FIG. 3a where the fuse is in the unprogrammed state.

Referring to FIGS. 3a-3b, there are shown respectively scanning electron microscope (SEM) micrograph views of a programmed thin oxide gate NFET e-fuse (FIG. 3a) and in the unprogrammed state (FIG. 3b), according to the present invention.

It is evident that once silicided electromigration from source to drain of the device takes place through the channel region, it renders the channel highly conductive under appropriate programming conditions. In contrast, as shown in FIG. 3b, in the unprogrammed state, the device shows no silicide presence in the channel. Also shown in FIG. 3a are the drain junction breakdown and silicide migration into the substrate.

The present invention preferably uses a MOSFET having the minimum channel length and width allowed by the technology node and does not require a separate fuse element. The 'fuse-like behavior' is achieved in the 'single' MOSFET device by the electromigration programming mechanism induced between the source and drain terminals that renders the channel highly conductive. It is known that the required current density to induce electromigration in silicided polysilicon material is approximately 1e5 A/cm$^2$.

Electromigration is induced in the MOSFET by applying a potential between the drain and source terminals, while the gate terminal is shorted to the drain or source of the device. Typically, a pulse of amplitude $\leq$5V and duration of 10 μsec is applied to the drain of a thin gate oxide NFET device in, e.g., a CMOS 65 nm node, while maintaining the source terminal grounded. By measuring the peak pulse current during the MOSFET programming it is determined that the current approximates 5 mA/μm of the channel width. This corresponds to a current density of approximately 5e5 A/cm², sufficient to initiate electromigration of the silicide from the source junction to the drain junction through the channel of the device. For a thicker gate oxide NFET, the voltage requirement is correspondingly higher.

Similarly, in the case of a thin gate oxide PFET the voltage polarity needs to be reversed and a pulse amplitude ≦−8V and same pulse width are applied to the drain of the device with respect to the source terminal. It has been observed from the measurement data that, generally. PFET devices with an equivalent gate oxide thickness require a somewhat larger voltage for programming, when compared to an NFET device.

1. Programming a Typical Thin Oxide NFET for a 65 nm Technology Node:

The drain is pulsed by way of a pulse having an amplitude of approximately 5V and pulse width of 10 μsec or higher. The source is grounded, and the gate is attached to the drain or to the source. Current is forced through the channel that exceeds a current density of $10^5$ A/cm². The silicide from the source junction moves toward the drain junction through the channel as a result of the electromigration.

2. Programming a Typical Thin Oxide PFET for a 65 nm Technology Node:

The drain is pulsed by way of a pulse having an amplitude ≦−8V and a pulse duration of at least 10 μsec. The source is grounded and the gate is either attached to the drain or to the source. Current is forced through the channel, exceeding a current density of $10^5$ A/cm². Silicide from the drain junction moves toward the source junction through the channel due to electromigration.

Figure 4A:
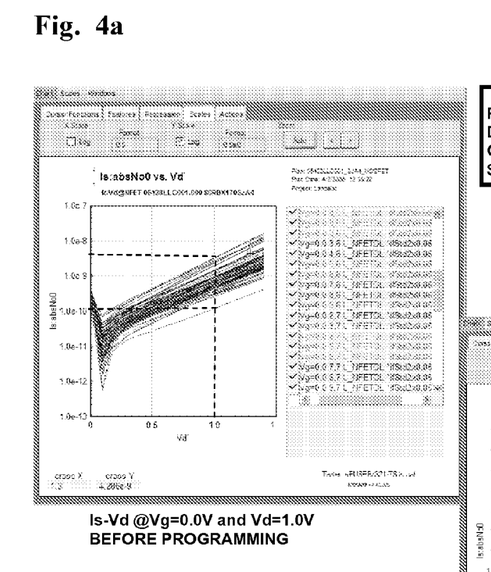
FIGS. 4a-4b are two plots respectively showing the current flow in the source of a MOSFET fuse, before programming (FIG. 4a), and after programming (FIG. 4b).
Figure 4B:
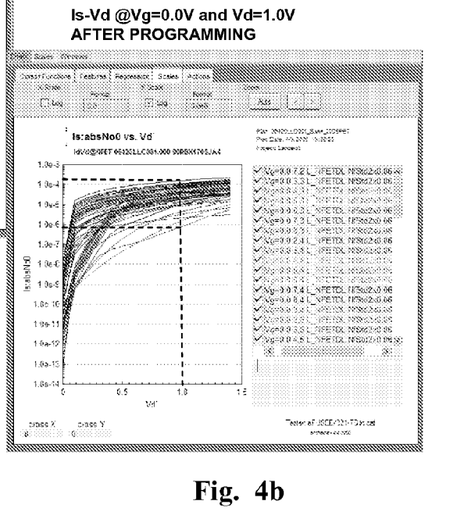

Referring now to FIG. 4b, there is shown a current flow (Is) in the source of the MOSFET fuse measured under bias conditions of a drain voltage Vd=1.0V, with the gate and source grounded. The device is preferably programmed using a pulse having a magnitude of 5V and duration of 10 μsec.

Still referring to FIG. 4, the MOSFET e-fuse in FIG. 4a is shown before programming, and in FIG. 4(b), after programming. Note, that the ratio of the source current (Is) before and after programming is found to be:

$Is$ (after programming)/$Is$ (before programming)>1 $e4$, which indicates a channel conductivity change by the stated ratio before and after programming.

Table 1 shows a programming matrix illustrating the conditions used when programming the MOSFET e-fuse. As shown, NFET devices are preferably programmed with a drain voltage of 5 volts. The programmability is 100% if a pulse width of 10 μsec. is used with a channel $I_{on}$ ratio (after programming/before programming) greater than 1e4 when measured when the gate to source voltage $V_g$=0V and the drain to source voltage $V_d$=1.0V. (See FIG. 4).

TABLE I

| Device | Pulse Amplitude (volts) | Pulse Width (μsec) | $Ion_{after}/Ion_{before}$ |
|---|---|---|---|
| SGNFET(2 × 0.06) | 5.0 | 50 | >1e4 |
| SGNFET(2 × 0.06) | 5.0 | 10 | >1e4 |
| SGNFET(2 × 0.06) | 5.0 | 5 | >1e4 |
| SGNFET(2 × 0.06) | 4.0 | 50 | >1e4 |
| SGPFET(2 × 0.06) | −8.0 | 50 | >1e2 |

3. Sensing the Programmed/Unprogrammed MOSFET i.) Sensing by way of the channel current from source to drain When the FET is off, the programmed device conducts current through the channel region as previously described. With the device in the off state, the unprogrammed FET conducts very small amounts of current through the channel region. The ratio of the current through the channel for the programmed when compared to that of the unprogrammed fuse is about $10^4$ (i.e., four orders of magnitude or higher). A single ended or a differential sensing circuit is preferably used to sense this channel conductance and easily distinguishes a programmed from an unprogrammed FET.

ii.) Sensing by way of the source or drain current to the substrate The programmed FET conducts current from the source or the drain to the substrate, that is significantly higher than the reverse biased junction current. The unprogrammed FET conducts very small currents from the source or the drain to the substrate, just as expected in any normal reverse biased junction. The ratio of the current to the substrate for the programmed to the unprogrammed fuse is about $10^3$ (i.e., three orders of magnitude). A single ended or a differential sensing circuit senses this current to the substrate and distinguishes a programmed from an unprogrammed fuse.

Figure 5:
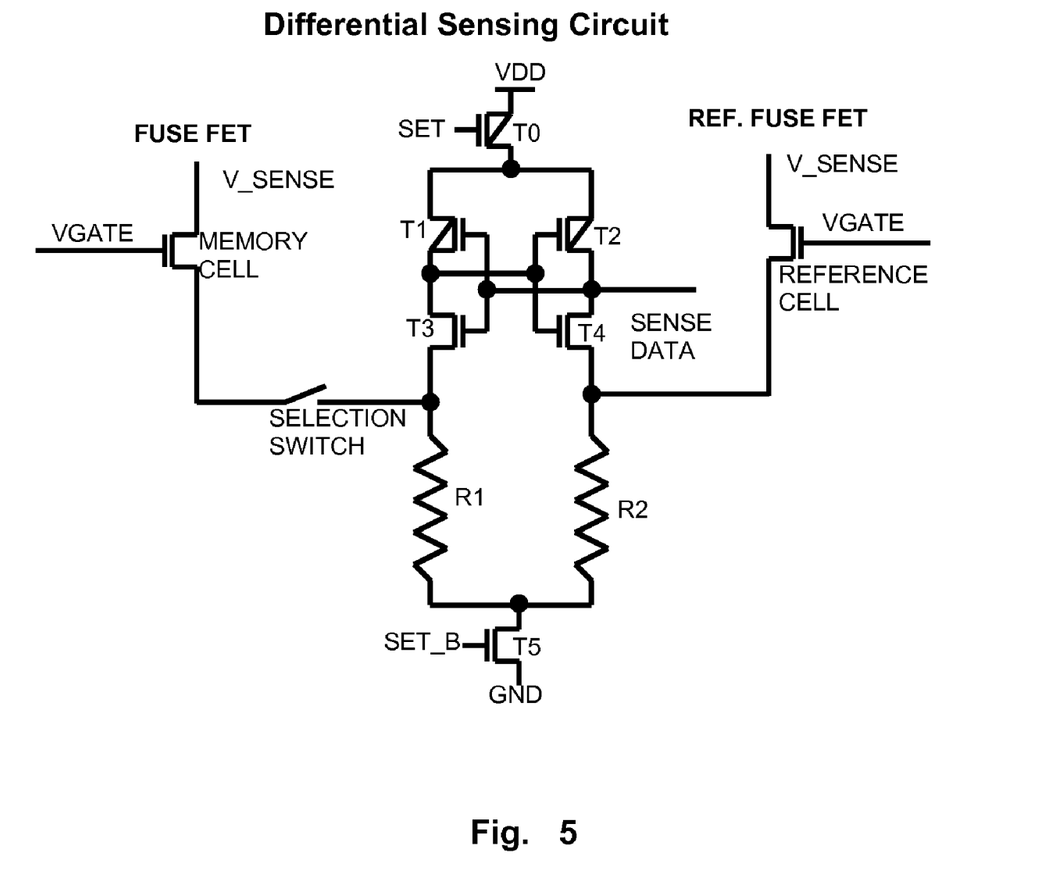
FIG. 5 is a schematic diagram of a sensing circuit used for the FET fuse of the present invention to compare the programmed or unprogrammed FET to a reference FET.

Sensing the FET fuse is achieved by comparing the programmed or unprogrammed device against a reference FET, as illustrated in FIG. 5. Shown is a differential sensing schematic diagram that compares the current through the selected memory cell with the current through a reference cell.

Transistors T1, T2, T3, and T4 form a latch. R1 and R2 are two identical resistors. The p-type transistor T0 connects the top of the latch to VDD, and the n-type transistor T5 connects the bottom of the latch to ground. With SET and SET_B clock pulses, the latch is connected to VDD and ground. At this time, depending on which node is high, FUSEFET or RFERENCE FUSEFET, the latch will set in the direction of higher voltage node. To sense the memory cell, the cell is connected to the sense amplifier through a selection switch. The voltage V_SENSE is set at 1 V. As discussed earlier, the sense latch is set by bringing the signal SET to low to turn the PFET on and SET_B to high to turn the NFET on. When the cell is programmed, the "sense data" node switches to high.

The programmable element can be used for redundancy or for customizing semiconductor chips. It can also be used as a storage element in Read Only Memories (ROM), as will be described hereinafter with reference to FIG. 6.

Figure 6:
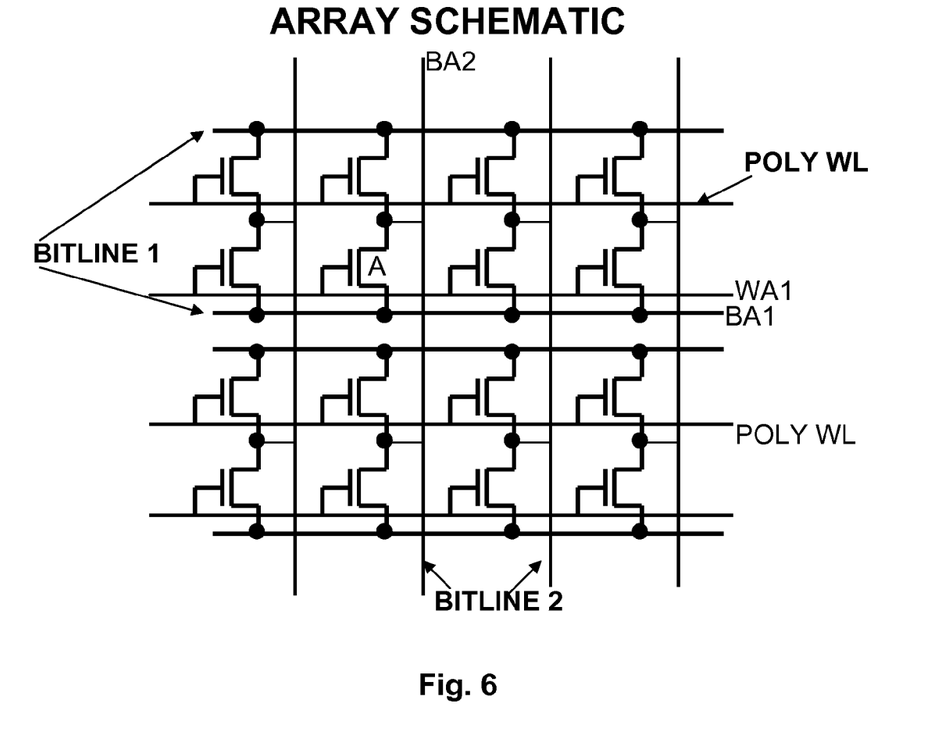
FIG. 6 shows a matrix of e-fuses configured for programming purposes.

Referring now to FIG. 6, bitline 1 is formed by metal layer M1 and polysilicon. The wordlines run horizontally. Bitline 2 is formed by metal layer M2, and runs vertically. Two bitlines and one wordline uniquely define each memory cell. For example, in order to program or read cell A, bitlines BA1, BA2, and wordline WA1 are preferably used. To program cell A, a voltage pulse having a 4V magnitude and pulse width larger than 10 μsec are applied to both bitline BA1 and wordline WA1. Bitline BA2 is grounded. Current through the cell device A causes electromigration of the silicide into the channel region, programming the memory element. To sense cell A, bitline BA1 and wordline WA1 are grounded. Approximately, 1V is applied to bitline BA2. The current through bitline BA2 is sensed, determining whether or not the cell is programmed.

Polysilicon wordlines are used for a dense array layout. The polysilicon wordlines form the gate of the memory element (fuse) transistor. If metal wordlines are used, then contact needs to be made with the gate of each memory element (fuse) transistor at the expense of space.

Figure 7:
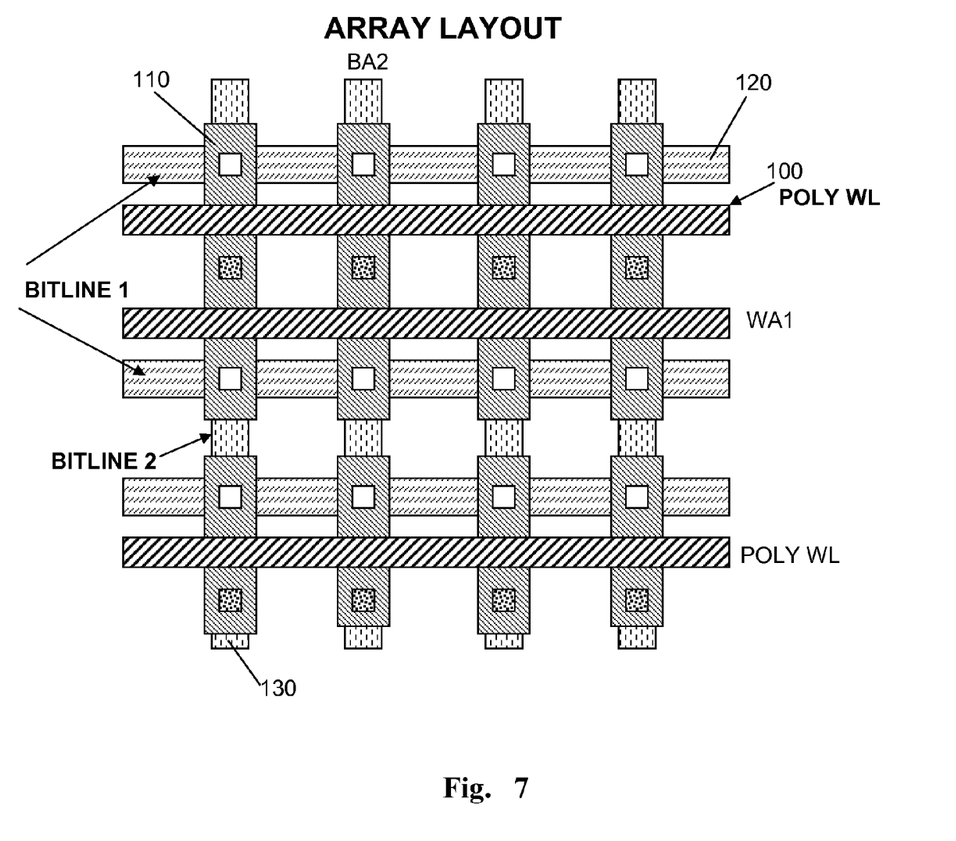
FIG. 7 shows a ROM array layout corresponding to the array configuration illustrated in FIG. 6.

Referring now to FIG. 7, there is shown a layout corresponding to the ROM architecture shown in FIG. 6. The horizontal lines 100 are polysilicon wordlines (denoted by WA1). The vertical rectangles 110 are the device diffusions. Polysilicon wordlines form the gate of the devices. The horizontal polysilicon together with the vertical diffusion form the memory element (fuse transistor).

Furthermore, in the layout of FIG. 7, two transistors have a common source (shared diffusion) to save layout area. Bitline 1 (denoted by BA1) 120 is formed by metal 1 (or M1). Bitline 1 makes contact with the drain of each transistor. The Bitline 2 is denoted by BA2 or 130 and is formed by vertical metal 2 or M2. Bitline 2 makes contact with the shared source of each transistor.

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A fuse, comprising:
    a field effect (FET) transistor having a silicided gate, silicided source and silicided drain, wherein said source and drain are coupled to each other by a silicided channel; and
    a voltage stimulus applied to said drain, with said source grounded and said gate connected to said drain, said applied voltage inducing electromigration of nitride silicide (NiSi) in said silicided channel by current flowing through said silicided channel.

2. The FET fuse as recited in claim 1, wherein said FET is a PFET or an NFET device.

3. The FET fuse as recited in claim 1, wherein a current through said channel exceeds a threshold current density that initiates said electromigration between said source and drain through said channel.

4. The FET fuse as recited in claim 1, wherein said fuse is formed in a substrate.

5. The FET fuse as recited in claim 4, wherein a junction breakdown between said drain and said substrate causes a short of the silicide.

6. The FET fuse as recited in claim 1, wherein sensing means detect said current flowing from said drain to said source through said channel when programming said FET fuse.

7. The FET fuse as recited in claim 6, wherein said sensing means utilize a reverse biased junction current from said drain to said substrate to program or deprogram said FET fuse.

8. The FET fuse as recited in claim 1, wherein said fuse is provided with a minimum channel that can be resolved by lithography.

9. The FET fuse as recited in claim 7, wherein said minimum channel length is 65 nm.

10. The FET fuse as recited in claim 9, wherein the channel having said minimum length precludes forming a hot spot in said channel when said electromigration is induced under said applied voltage conditions.

11. The FET fuse as recited in claim 10, wherein said applied voltage ranges from 4 to 5V for an NFET fuse.

12. The FET fuse as recited in claim 9, wherein said applied voltage ranges from −5 to −10V for a PFET fuse.

13. The FET fuse as recited in claim 11, wherein said applied voltage has a duration ranging from 5 μsec to 200 μsec.

14. An electrical fuse device integral to a substrate comprising:
    a field effect (FET) transistor in said substrate having a silicided gate, silicided source and silicided drain, wherein said source and drain are coupled to each other by a silicided channel; and
    a voltage stimulus is applied to said silicided drain, with said silicided source and said silicided gate grounded, said applied voltage inducing electromigration of nitride silicide (NiSi) in said silicided channel by current flowing through said silicided channel.

* * * * *